United States Patent [19]
Funaki et al.

[11] Patent Number: 6,133,607
[45] Date of Patent: *Oct. 17, 2000

[54] SEMICONDUCTOR DEVICE

[75] Inventors: Hideyuki Funaki, Tokyo; Akio Nakagawa, Yokohama, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/082,937

[22] Filed: May 22, 1998

[30] Foreign Application Priority Data

May 22, 1997 [JP] Japan ..................................... 9-132395

[51] Int. Cl.$^7$ .................................................. H01L 29/76
[52] U.S. Cl. ........................... 257/343; 257/335; 257/327
[58] Field of Search ................................... 257/328–343, 257/132–141; 438/268–274

[56] References Cited

U.S. PATENT DOCUMENTS

| | | | |
|---|---|---|---|
| 5,072,287 | 12/1991 | Nakagawa et al. | 257/500 |
| 5,237,186 | 8/1993 | Nakagawa et al. | 257/327 |
| 5,432,370 | 7/1995 | Kitamura et al. | 257/339 |
| 5,585,651 | 12/1996 | Kitagawa et al. | 257/139 |
| 5,670,811 | 9/1997 | Mori et al. | 257/341 |
| 5,729,031 | 3/1998 | Uenishi | 257/133 |
| 5,731,603 | 3/1998 | Nakagawa et al. | 257/141 |
| 5,780,887 | 7/1998 | Nakagawa et al. | 257/298 |

OTHER PUBLICATIONS

Norio Yasuhara, et al., "SOI Layer Thickness and Buried Oxide Thickness Dependencies of High Voltage Lateral IGBT Switching Characteristics," Extended Abstracts of the 1993 International Conference on Solid State Devices and Materials, Makuhari, (1993), pp. 270–272.

Logic Drive Consideration for Trench–Gate IGBT by H. Takahashi et al 1997 IEEE—Feb. 1997, pp. 205–208.

A Safe Operating Area Model for SOI Lateral IGBTs by Tomoko Matsudai et al 1997 IEEE—Feb. 1997, pp. 41–44.

Multi–Channel SOI Lateral IGBTS with Large SOA by Hideyuki Funaki et al 1997 IEEE—Feb. 1997, pp. 33–36.

Primary Examiner—Tom Thomas
Assistant Examiner—Ori Nadav
Attorney, Agent, or Firm—Oblon, Spivak, McClelland, Maier & Neustadt, P.C.

[57] ABSTRACT

The present invention provides a semiconductor device having high-speed switching characteristics and high output characteristics. More specifically, the semiconductor device includes a second conductivity type drain layer having a low impurity concentration, for decreasing the efficiency of injecting holes, and a second conductivity type contact layer having a high impurity concentration, for avoiding an increase in contact resistance. With this structure, an increase in ON-state voltage can be avoided while improving the switching rate by the second conductivity type drain layer. That is, the present invention achieves high-speed switching characteristics and high output characteristics at the same time.

9 Claims, 6 Drawing Sheets

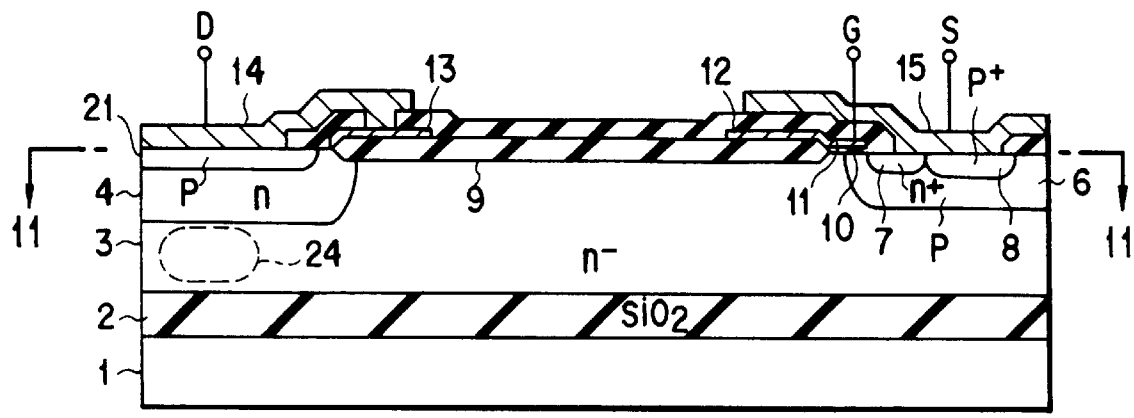
F I G. 12
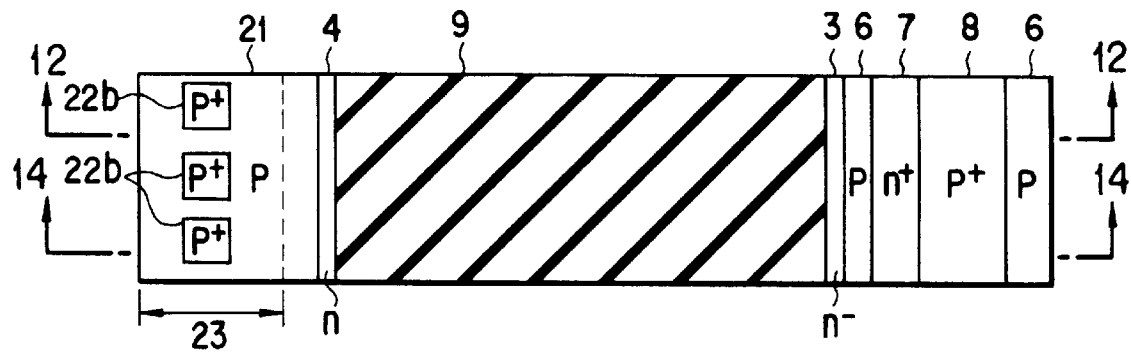
F I G. 13
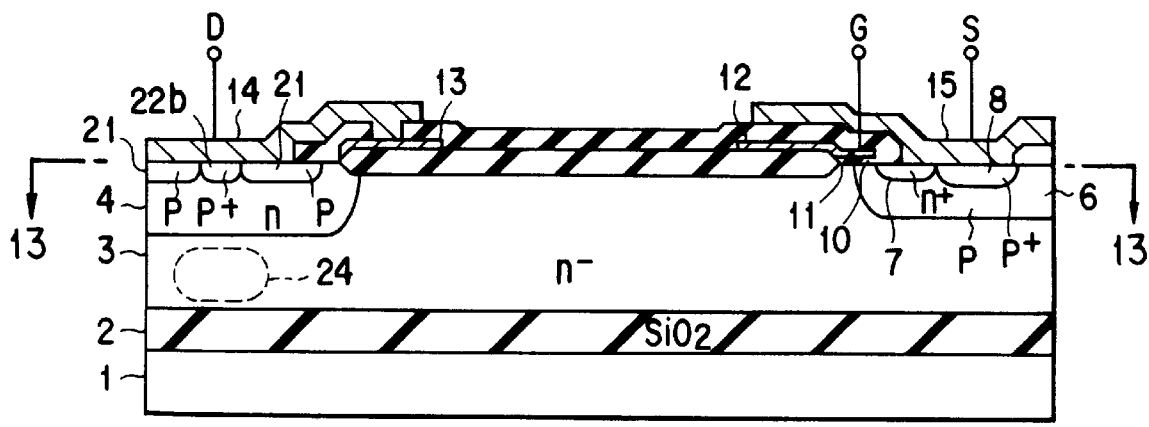
F I G. 14

SEMICONDUCTOR DEVICE

BACKGROUND OF THE INVENTION

The present invention relates to a semiconductor device, and more specifically to a semiconductor device using an SOI (Silicon On Insulator) on substrate.

In the field of the power electronics, an IGBT (insulated gate bipolar transistor) which combines the convenience that the voltage can be driven by its gate, and a high output property of a bipolar transistor is available at the same time, is widely used. Due to the above-described advantages, such an IGBT is capable of controlling a larger current than by a power MOSFET.

FIG. 1 is a plan view illustrating the structure of a lateral-type IGBT of the above-mentioned type, taken at the interface between the electrode and semiconductor, and FIG. 2 is a cross sectional view taken along the line 2—2 of FIG. 1, with the electrode. In the present specification, the plan views are taken at the interface between the electrode and semiconductor, whereas the cross sectional views are illustrated with the electrode set on the transistor.

In the lateral-type IGBT, a buried oxide layer 2 of SiO2 and an n-type active layer 3 having a high resistance, are formed in the order on a silicon substrate 1. An approximately stripe-type n-type buffer layer 4 is formed selectively in the surface portion of the n-type active layer 3 such that the buffer layer 4 does not reach the buried oxide film 2. Thus, a p$^+$-type drain layer 5 serving as a p-type emitter layer is formed selectively in an approximately stripe-like manner, in the surface portion of the n-type buffer layer 4.

It should be noted that the n-type active layer 3 has a dose amount of about $1 \times 10^{12}$ cm$^{-2}$. The n-type buffer 4 is formed by the ion implantation of, for example, phosphorus, and has a dose amount of $5 \times 10^{13}$ to $2 \times 10^{14}$ cm$^{-2}$. Further, the p$^+$-type drain layer 5 has a dose amount of $1 \times 10^{15}$ cm$^{-2}$ or more; however the dose amount may be $8 \times 10^{14}$ cm$^{-2}$.

Further, on the surface of the n-type active layer 3, which is different from the n-type buffer layer 4, an approximately stripe-shaped p-type base layer 6 is formed selectively such that it does not reach the buried oxide layer 2, and in the surface portion of the p-type base layer 6, a n$^+$-type source layer 7 and a p$^+$-type contact layer 8, each of which has a low resistance, are formed to have an approximately a stripe shape.

In the surface region from a portion of the n-type buffer layer 4 to the vicinity of the p-type base layer 6 in the n$^-$-type active layer 3, a LOCOS oxide film 9 is formed, and on the region from an end of the n$^-$-type active layer 3 located adjacent to the LOCOS oxide film 9 to a portion of the p-type base layer 6 and the n$^+$-type source layer 7, a gate oxide film 10 is formed.

A gate electrode 11 is formed on the gate oxide film 10, and an S-side field plate 12 which slightly extends from the gate electrode 11 towards the drain side, is formed on the LOCOS oxide film 9. In a similar manner, a D-side field plate 13 is formed in the vicinity of the n-type buffer layer 4 on the LOCOS oxide film 9.

On the p$^+$-type drain layer 5, a drain electrode 14 is formed to be in contact with a portion of the surface of the D-side field plate 13 as well. Further, a source electrode 15 is formed on the n$^+$-type source layer 7 and the p$^+$-type contact layer 8.

With the above-described structure, when a positive voltage is applied to the gate electrode 11, electrons appear on the surface of the p-type base layer 6 which is located directly underneath the gate such that the amount of electrons is proportional to the positive voltage, and the surface of the p-type base layer 6 is reversed to an n-type region. The reversed region becomes a channel, and thus the n$^+$-type source layer 7 and the n-type active layer 3 are short-circuited to each other.

Next, when a positive voltage is applied to the drain electrode 14 and a negative voltage is applied to the source electrode 15, electrons are supplied from the source electrode 15, and injected to the n$^-$-type active layer 3 from the n$^+$-type source layer 7 via the channel. Thus, holes are injected from the p$^+$-type drain layer 5 to the n$^-$-type active layer 3 via the n-type buffer layer 4. Due to the injection of the holes, a conduction modulation occurs, in which electrons and holes are present at high densities and they coexist substantially at the same density such as to cancel their electrical charges with each other. Consequently, the ON-state resistance is lowered, and the conduction state is established.

As a result, electrons in the n$^-$-type active layer 3 flow to the drain electrode 14 via the p$^+$-type drain layer 5, whereas holes in the n$^-$-type active layer 3 flow to the source electrode 15 via the p-type base layer 6.

In the meantime, at the time of turning OFF, a positive gate voltage is removed from the gate electrode 11. Consequently, a channel layer disappears on the surface of the p-type base layer 6 which is situated directly underneath the gate, and thus the n$^+$-type source layer 7 and the n$^-$-type active layer 3 are shut off from each other, thus stopping the injection of the electrons. On the other hand, with regard to the holes in the n$^-$-type active layer 3, some of them are discharged to the source electrode 15 via the p-type base layer 6, and the rest of them are recombined with electrons and extinguished. Thus, the lateral-type IGBT is turned off.

However, in an IGBT of the above-described type, holes which are minority carriers are injected to the n$^-$-type active layer 3 so as to induce a conduction modulation, and thus the ON-state resistance is lowered. With this manner, even if the gate is shut off and the injection of electrons is stopped, a current still flows to the element while accumulated holes are being discharged. Therefore, such an IGBT entails a drawback that the switching rate is slow as compared to a power MOSFET. In order to solve this drawback, and improve the switching characteristics of a lateral-type IGBT, it is necessary to control the efficiency of the injection of holes from the drain.

The following are some of the examples, namely techniques (a) to (c) for controlling the injection efficiency.

(a) In this technique, a portion of the drain electrode 14 is contacted to the n$^-$-type active layer 3. However, with this technique, holes are not sufficiently injected during the ON state, and therefore the ON-state characteristics are deteriorated.

(b) In this technique, the dose amount of the n-type buffer layer 4 is increased. The details will now be described with reference to the curve N shown in FIG. 3. The curve N indicates the trade off between an ON voltage Vf and a turn-off time Tf while the dose amount of the n-type buffer layer 4 is varied. As can be understood from the curve N, this technique is effective for the improvement of the switching rate up to about 500 ns; however it cannot be applied in practice for the manufacture of a lateral-type IGBT having a turn-off time Tf of that rate or less since the dose amount of the n-type buffer layer 4 exceeds $1 \times 10^{15}$ cm$^{-2}$, and the ON voltage becomes very high in such a case.

(c) This technique is an improved version which has been proposed to solve the drawback of the technique (b), and in this technique, the dose amount of the n-type buffer layer 4 is maintained as it is, and the dose amount of the p$^+$-type drain layer 5 is decreased. With this technique, as can be understood from the curve P in FIG. 3, and the illustration of FIG. 4, the turn-off time Tf can be improved to about 300 ns; however in the case where the turn-off time is set at 300 ns or less, it becomes necessary to decrease the surface concentration of the p$^+$-type drain layer 5. When the surface concentration becomes $1\times10^{19}$ cm$^{-3}$, it becomes very difficult to make an ohmic contact. As a result, a Schottky barrier occurs and the contact resistance is increased. Consequently, the ON-state voltage Vf is increased, which is not desirable.

As described above, the lateral-type IGBT entails the drawback of a long turn-off time Tf. However, if the turn-off time is shortened, another problem of an increase in the ON-state voltage Vf occurs. Further, with such an increase in the ON-state voltage Vf, the output characteristics are deteriorated, and the electrical current value which enables the operation is lowered.

BRIEF SUMMARY OF THE INVENTION

The object of the present invention is to provide a semiconductor device having high-speed switching characteristics and high-output characteristics at the same time.

The semiconductor device according to the present invention includes: a semiconductor substrate; an insulating layer formed on the semiconductor substrate; a first conductivity type active layer having a high resistance and formed on the insulating layer; a first conductivity type buffer layer formed in a surface portion of the first conductivity type active layer; a second conductivity type drain layer formed in a surface portion of the first conductivity type buffer layer; a second conductivity type contact layer formed in a surface portion of the second type drain layer, the second conductivity type contact layer having a concentration higher than that of the second conductivity type drain layer; a drain electrode formed on the second conductivity type contact layer and the second conductivity type drain layer; a second conductivity type base layer formed in the surface portion of the first conductivity type active layer; a first conductivity type source layer formed in a surface portion of the second conductivity type base layer; a source electrode formed on the first conductivity type source layer and the second conductivity type base layer; and a gate electrode provided via a gate insulating film on the second conductivity type base layer which is interposed between the first conductivity type source layer and the first conductivity type active layer.

It is possible that the second conductivity type contact layer is formed in an island-like shape to be along the direction approximately perpendicular to the current path in the second conductivity type drain layer.

It is possible that the second conductivity type contact layer is formed in a stripe shape arranged such that the longitudinal direction of the stripe shape is approximately parallel to the current path in the second conductivity type drain layer.

It is possible that the ratio obtained by dividing the surface area of the second conductivity type contact layer by the surface area of the second conductivity type drain layer falls within a range from 10 to 78%.

It is possible that the impurity concentration of a surface of the second conductivity type contact layer is $1\times10^{19}$ cm$^{-3}$ or higher, and the impurity concentration of a surface of the second conductivity type drain layer is $2\times10^{18}$ cm$^{-3}$ (from $1\times10^{18}$ to $3\times10^{18}$ cm$^{-3}$).

With the above-described structure of the present invention, that is, the structure including the second conductivity type drain layer having a low impurity concentration, for decreasing the efficiency of injecting holes, and the second conductivity type contact layer having a high impurity concentration, for avoiding an increase in contact resistance, an increase in ON-state voltage can be avoided while improving the switching rate by the second conductivity type drain layer. That is, high-speed switching characteristics and high output characteristics can be achieved at the same time by the present invention.

Further, with the second conductivity type contact layer formed in an island-like manner, the efficiency of injection of holes can be further decreased, and the rate of discharging holes can be further increased.

Furthermore, with the second conductivity type contact layer formed in a stripe manner, high-speed switching characteristics and high output characteristics can be achieved with better values at the same time.

Furthermore, with the ratio obtained by dividing the surface area of the second conductivity type contact layer by the surface area of the second conductivity type drain layer, set in a range from 10 to 78%, the balance between the switching characteristics and the high output characteristics can be optimized.

Furthermore, with the impurity concentration of the surface of the second conductivity type contact layer set to $1\times10^{19}$ cm$^{-3}$ or higher, and the impurity concentration of the surface of the second conductivity type drain layer set from $1\times10^{18}$ cm$^{-3}$ to $3\times10^{18}$ cm$^{-3}$, the designing of the element can be facilitated.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

FIG. 12 is a cross sectional view taken along the line 12—12 in FIG. 11;

FIG. 13 is a plan view showing the structure of a lateral-type IGBT according to the fourth embodiment of the present invention;

FIG. 14 is a cross sectional view taken along the line 13—13 in FIG. 13;

DETAILED DESCRIPTION OF THE INVENTION

Embodiments of the present invention will now be described in detail with reference to accompanying figures.

First Embodiment

Figure 1:
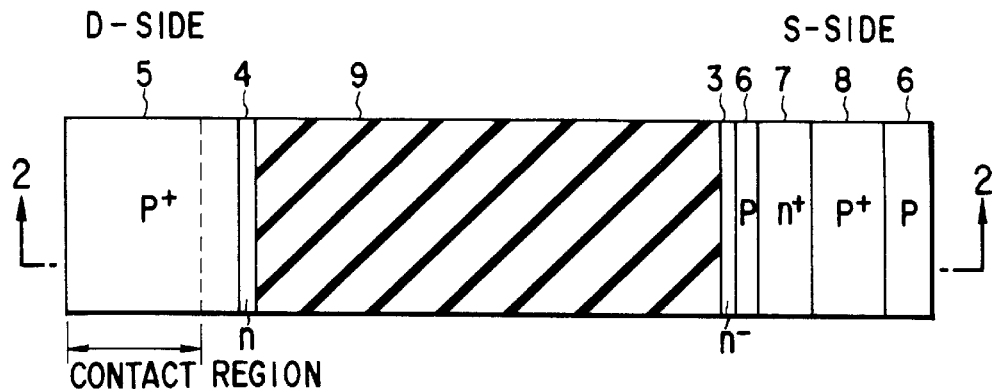
FIG. 1 is a plan view showing the structure of a conventional lateral-type IGBT.
Figure 2:
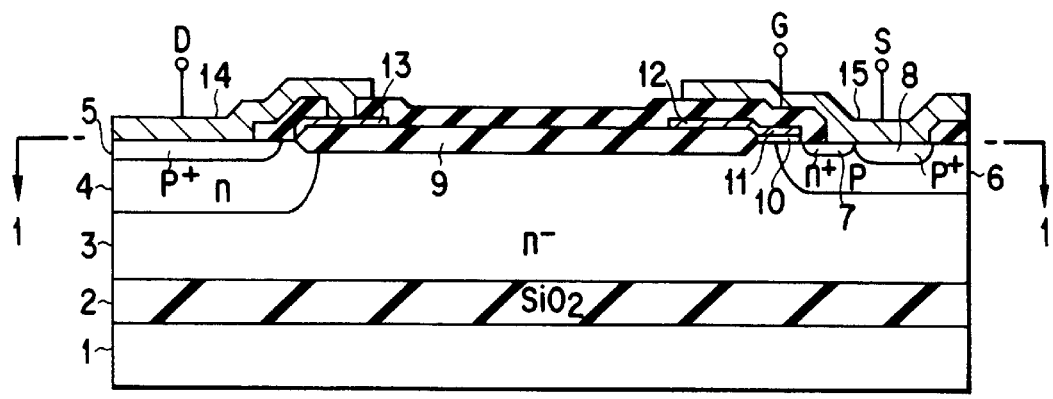
FIG. 2 is a cross sectional view taken along the line 2—2 in FIG. 1.
Figure 3:
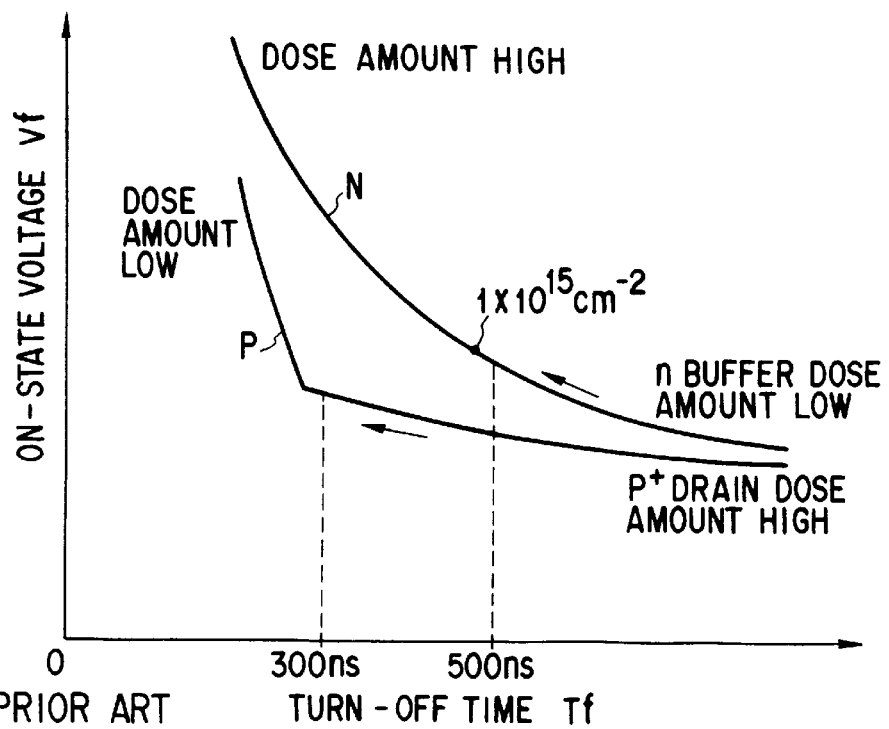
FIGS. 3 and 4 each are a graph illustrating a trade-off curve of the conventional lateral-type IGBT.
Figure 4:
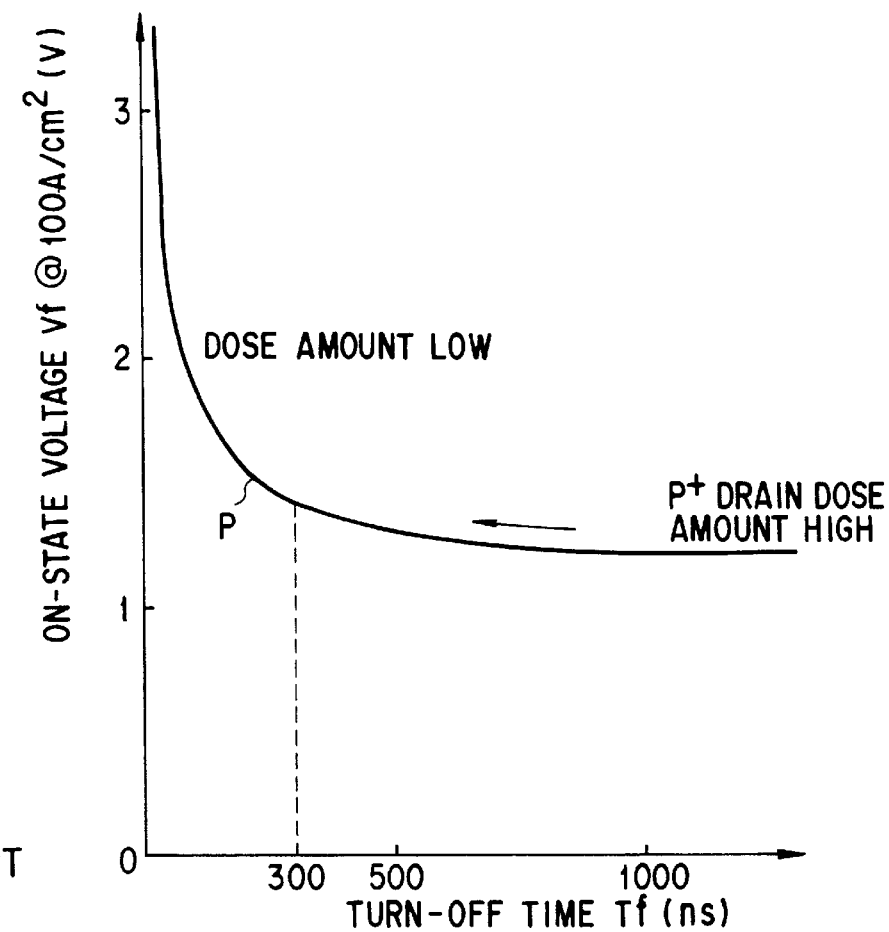
Figure 5:
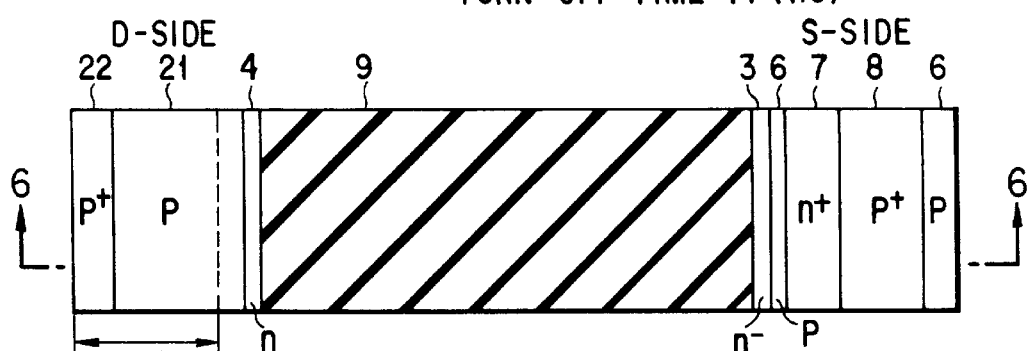
FIG. 5 is a plan view showing the structure of a lateral-type IGBT according to the first embodiment of the present invention.
Figure 6:
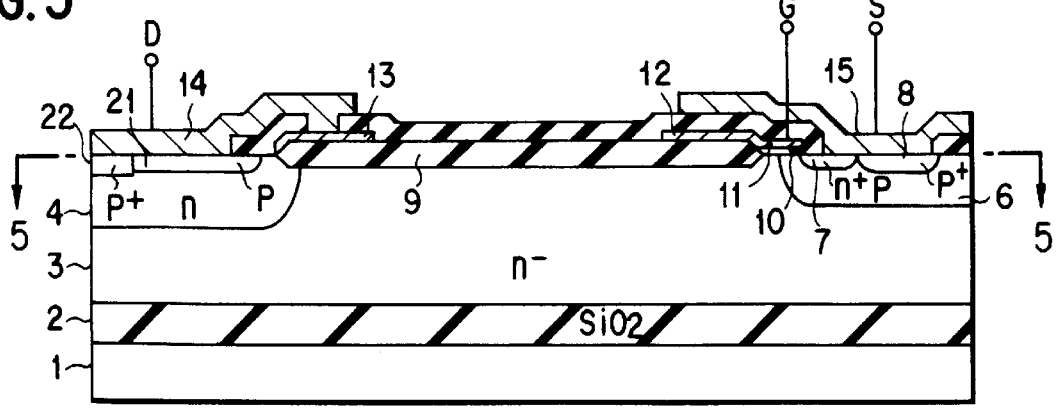
FIG. 6 is a cross sectional view taken along the line 6—6 in FIG. 5.

FIG. 5 is a plan view showing the structure of a lateral-type IGBT according to the first embodiment of the present invention, and FIG. 6 is a cross sectional view taken along the line 6—6 in FIG. 5. The same structural elements as those illustrated in FIGS. 1 and 2 are designated by the same reference numerals, and the detailed descriptions therefor will not be repeated here. Rather, the elements different from those of FIGS. 1 and 2 will be mainly discussed.

Figure 7:
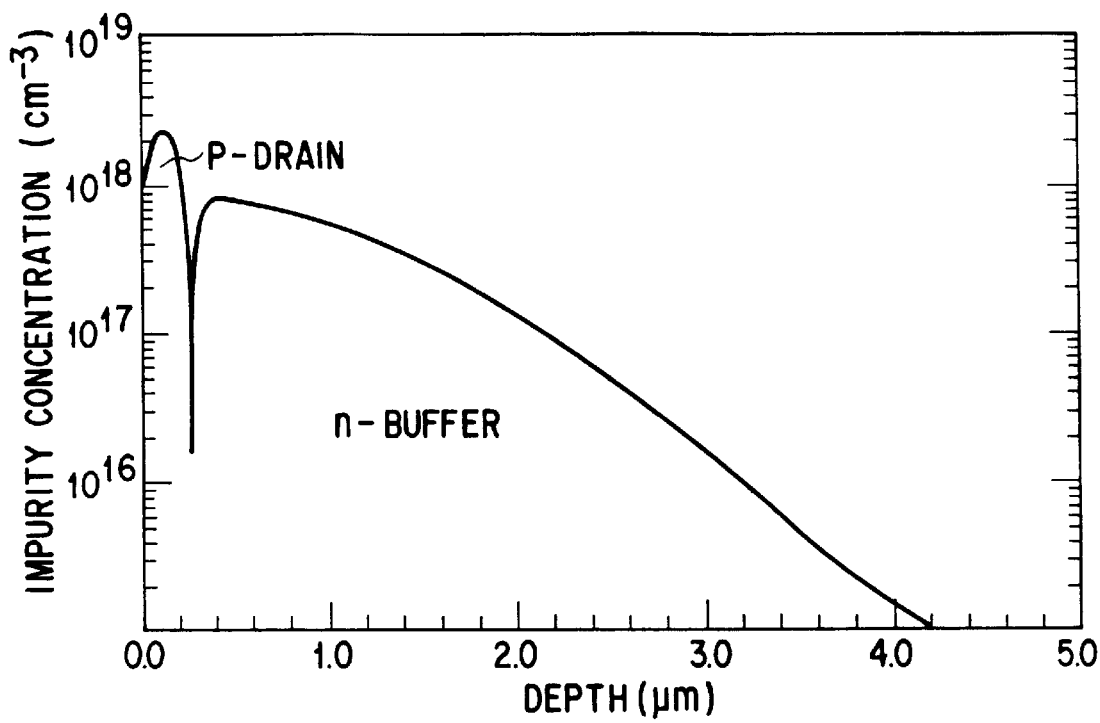
FIG. 7 is a graph illustrating the distribution of the impurity concentration on the p-type drain layer side in the depth direction in this embodiment.

This embodiment is designed to avoid the lowering of the efficiency of injecting holes and the increasing of the contact resistance at the same time. The device according to this embodiment, as can be seen in FIGS. 5 and 6, includes a p-type drain layer 21 having a low impurity concentration and formed selectively on the surface of a n-type buffer layer 4, in place of the $p^+$-type drain layer, and a $p^+$-type contact layer 22 having an impurity concentration higher than that of the p-type drain layer 21 and formed selectively in the surface of the p-type drain layer 21. It should be noted that the distribution of the impurity concentration taken along the depth direction on the drain side is shown in FIG. 7.

The p-type drain layer 21 is formed to a depth of 0.25 μm by ion implantation of boron at, for example, a low dose amount ($1 \times 10^{14}$ cm$^{-2}$), and the impurity concentration of the surface portion thereof is about $2 \times 10^{18}$ cm$^{-3}$.

The reasons for setting the impurity concentration of the p-type drain layer 21 from $1 \times 10^{18}$ to $3 \times 10^{18}$ cm$^{-3}$ in the surface, are described as follows (a) and (b).

(a) For the n-type buffer layer 4 having an impurity concentration of about $1 \times 10^{18}$ cm$^{-3}$, if the p-type drain layer 21 has an impurity concentration of less than $1 \times 10^{18}$ cm$^{-3}$ in the surface, the impurity concentration of the p-type drain layer 21 will be lower than that of the n-type buffer layer 4, and therefore the forming of the p-type drain layer 21 will be meaningless.

(b) If the p-type drain layer 21 has an impurity concentration of higher than $3 \times 10^{18}$ cm$^{-3}$ in the surface, the impurity concentration of the p-type drain layer 21 will be substantially equal to that of the p-type contact layer 22, and therefore the forming of the p-type drain layer 21 will be meaningless.

The p-type contact layer 22 is formed to a depth of 0.1 μm by ion implantation of boron at, for example, a high dose amount ($1 \times 10^{15}$ cm$^{-2}$), and the impurity concentration of the surface portion thereof is about $1 \times 10^{19}$ cm$^{-3}$ or higher. In detail, the $p^+$-type contact layer 22 is formed in a stripe manner along the side away from the source electrode 15, in the contact region 23 with respect to the drain electrode 14, including the p-type drain layer 21 and the $p^+$-type contact layer 22.

The reason for setting the impurity concentration of the $p^+$-type contact layer 22 having to about $1 \times 10^{19}$ cm$^{-3}$ or higher, is that the contact resistance is increased if the impurity concentration is less than $1 \times 10^{19}$ cm$^{-3}$.

The n-type buffer layer 4 is formed to a depth of 4 μm by an ion implantation of phosphorus at, for example, a low dose amount ($1.5 \times 10^{14}$ cm$^{-2}$), and the impurity concentration of the surface portion thereof is about $1 \times 10^{18}$ cm$^{-3}$.

Next, the operation of the above-described lateral-type IGBT will now be described.

In this lateral-type IGBT, the impurity concentration of the p-type drain layer 21 is made lower than that of the conventional $p^+$-type drain layer 5 by controlling the amount of ion implantation of boron, so as to decrease the efficiency of the injection of holes during the operation. More specifically, the amount of holes injected during the operation of the device is lowered, so as to reduce the amount of holes accumulated in the $n^-$-type active layer 3, and thus the time for discharging the holes at switch-off is shortened. Consequently, the switching rate can be improved.

In the meantime, the present invention includes the $p^+$-type contact layer 22 having a high impurity concentration and a low resistance, for the purpose of avoiding an increase in contact resistance, which may be caused by lowering the impurity concentration of the p-type drain layer 21. With this structure, the present invention is capable of avoiding an increase in ON-state voltage by means of the $p^+$-type contact layer 22, while improving the switching rate by the p-type drain layer 21. In other words, the high-speed switching characteristics and the high-output characteristics can be realized at the same time.

Figure 8:
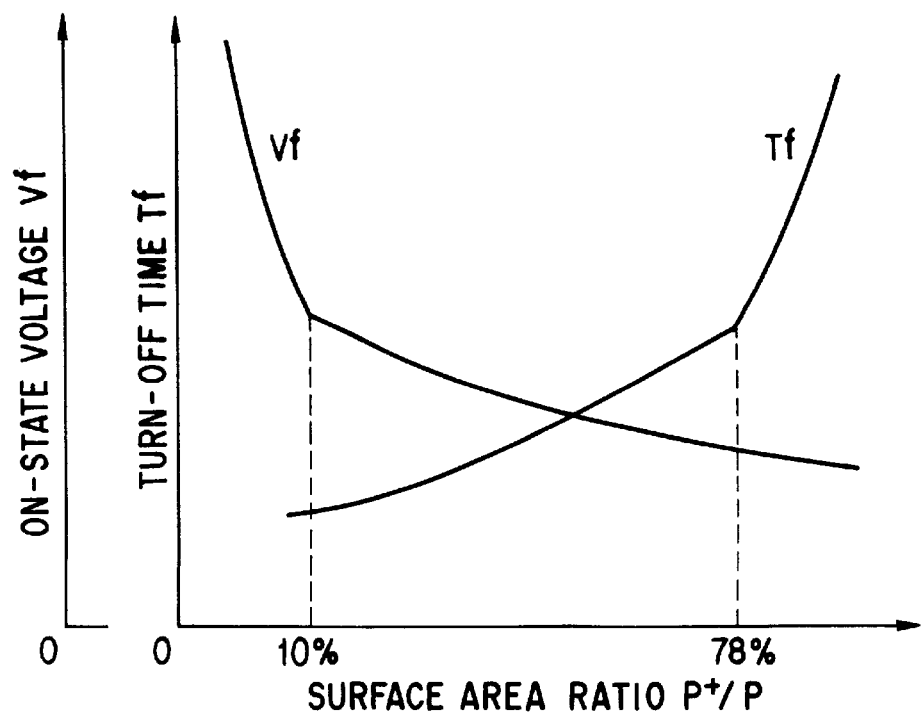
FIG. 8 is a graph illustrating a trade-off curve of the lateral-type IGBT according to this embodiment.

FIG. 8 is a graph illustrating the trade off curve of the lateral-type IGBT. The curve is defined by the surface product ratio between $p^+$-type contact layer 21 and p-type drain layer 22 as the horizontal axis and the turn-off time Tf and On-state voltage Vf as the vertical axis. As can be seen in the figure, the On-state voltage Vf is decreased in proportional to the surface area of the $p^+$-type contact layer 22, and the turn-off time Tf is shortened in proportional to the surface area of the p-type drain layer 21.

Further, with reference to FIG. 8, the surface area ratio between the $p^+$-type contact layer 21 and the p-type drain layer 22 is optimized, or set in a range of 10 to 78%. Thus, the balance between the switching characteristics and the high output characteristics are optimized, and a lateral-type IGBT having excellent trade-off characteristics can be realized.

As described above, according to the first embodiment, the p-type drain layer 21 having a low impurity concentration, designed for decreasing the hole injection efficiency and the $p^+$-type contact layer 22 having a high impurity concentration, designed for avoiding an increase in contact resistance, are provided. With this structure, the switching rate can be improved by the p-type drain layer 22 while avoiding an increase in the ON-state voltage by the $p^+$-type contact layer 22. Thus, the high-speed switching characteristics and the high output characteristics can be realized at the same time.

Second Embodiment

Figure 9:
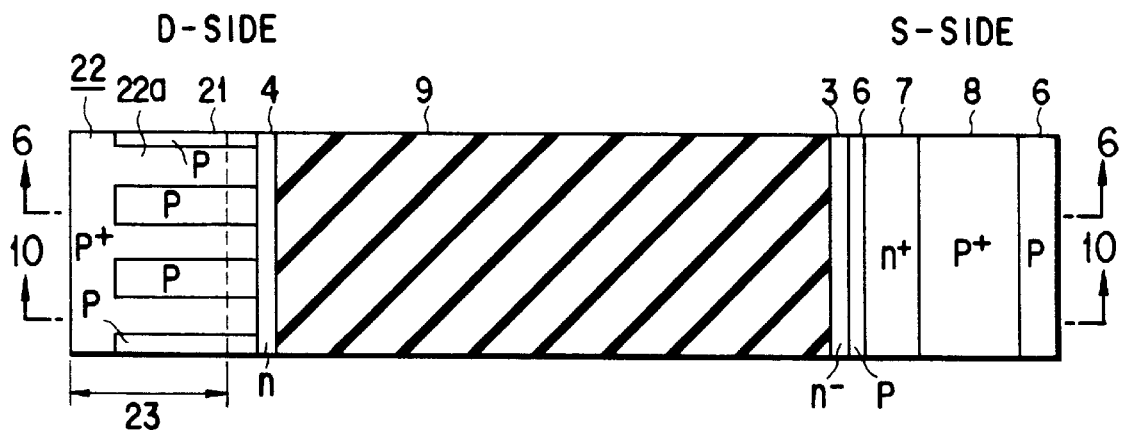
FIG. 9 is a plan view showing the structure of a lateral-type IGBT according to the second embodiment of the present invention.
Figure 10:
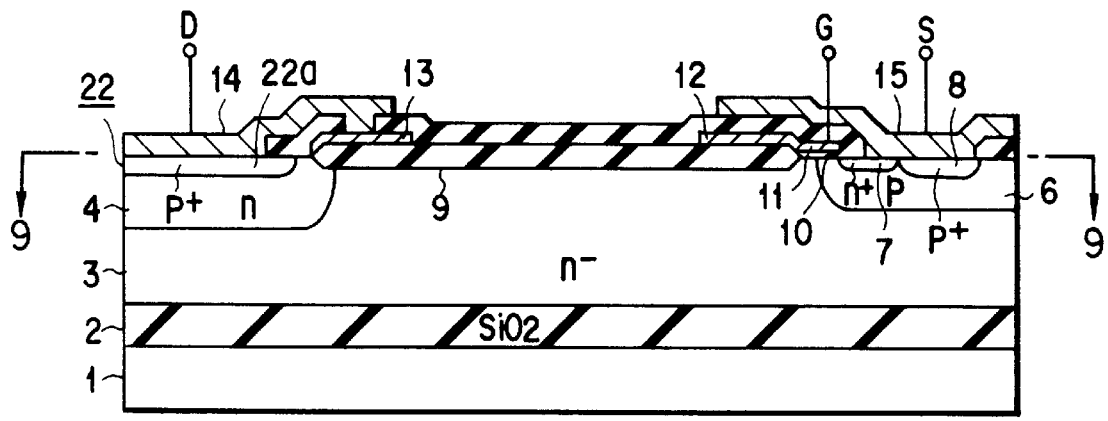
FIG. 10 is a cross sectional view taken along the line 10—10 in FIG. 9.

FIG. 9 is a plan view showing the structure of a lateral-type IGBT according to the second embodiment of the present invention, and FIG. 10 is a cross sectional view taken along the line 10—10 in FIG. 10. The same structural elements as those illustrated in FIGS. 5 and 6 are designated by the same reference numerals, and similar corresponding elements are designated by the same reference numerals suffixed by letter a. The detailed descriptions therefor will not be repeated here, and rather, the elements different from those of FIGS. 5 and 6 will be mainly discussed. It should be noted that the cross sectional view taken along the line 6—6 of FIG. 9 is the same as the cross sectional structure shown in FIG. 6.

This embodiment is designed to optimize the patterned shapes of the p-type drain layer 21 and the p$^+$-type contact layer 22. More specifically, as can be seen in FIGS. 9 and 10, a p$^+$-type contact layer 22a is formed selectively in the p-type drain layer 21 shown in FIG. 6 along the current path, so as to form the p$^+$-type contact layer 22 as a whole in the shape of comb teeth. It should be noted that the p$^+$-type contact layers 22 and 22a have the same impurity concentration, and the width and length of the p$^+$-type contact layer 22a can be arbitrarily set.

With the above-described structure, the efficiency of the injection of holes can be lowered as compared to the case of the first embodiment. Consequently, the second embodiment realizes the high-speed switching characteristics and the high output characteristics at better values, in addition to the advantage achieved by the first embodiment.

Third Embodiment

Figure 11:
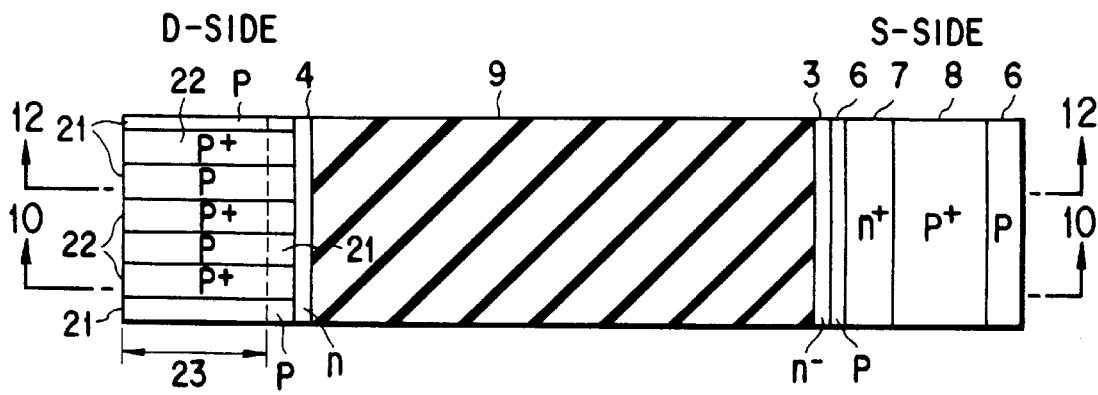
FIG. 11 is a plan view showing the structure of a lateral-type IGBT according to the third embodiment of the present invention.

FIG. 11 is a plan view showing the structure of a lateral-type IGBT according to the third embodiment of the present invention, and FIG. 12 is a cross sectional view taken along the line 12—12 in FIG. 11. The same structural elements as those illustrated in FIGS. 9 and 10 are designated by the same reference numerals, and the detailed descriptions therefor will not be repeated here. Rather, the elements different from those of FIGS. 9 and 10 will be mainly discussed. It should be noted that the cross sectional view taken along the line 10—10 of FIG. 11 is the same as the cross sectional structure shown in FIG. 10.

This embodiment is designed to optimize the patterned shapes of the p-type drain layer 21 and the p$^+$-type contact layer 22. More specifically, the present invention has, as can be seen in FIGS. 11 and 12, a structure which includes the p$^+$-type contact layers 22 and 22a and the p-type drain layer 21 formed alternately along the direction normal to the current path by extending the p-type drain layer 21 located between each adjacent pair of p$^+$-type contact layers 22a to the inside of the stripe-shaped p$^+$-type contact layer 22 so as to intermittently omit the p$^+$-type contact layer 22.

With the above-described structure, the hole injection efficiency can be further lowered as compared to the case of the second embodiment, and the discharging rate of holes can be further increased. It should be noted that the improvement of the hole discharging rate can be achieved by not only the lowering of the hole injection efficiency, but also the reduction of the amount of holes accumulated in the direction off the current path.

That is, in the lateral-type IGBT according to the present embodiment, a portion of the stripe-like p$^+$-type contact layer 22 is omitted, and therefore the amount of holes accumulated in the region 24 of the n$^-$-type active layer 3, located underneath the drain electrode 14 can be easily reduced. Thus, it becomes easy to discharge holes. It is considered that the rate of discharging holes can be further increased for the above-described reason.

As described above, according to the third embodiment, the high-speed switching characteristics and the high output characteristics can be realized at the same time even with better values, in addition to the advantage achieved by the second embodiment.

Fourth Embodiment

FIG. 13 is a plan view showing the structure of a lateral-type IGBT according to the fourth embodiment of the present invention, and FIG. 14 is a cross sectional view taken along the line 14—14 in FIG. 13. The same structural elements as those illustrated in FIG. 11 are designated by the same reference numerals, and similar corresponding elements are designated by the same reference numerals suffixed by letter b. The detailed descriptions therefor will not be repeated here. Rather, the elements different from those of FIG. 11 will be mainly discussed. It should be noted that the cross sectional view taken along the line 13—13 of FIG. 13 is the same as the cross sectional structure shown in FIG. 12.

This embodiment is designed to optimize the patterned shapes of the p-type drain layer 21 and the p$^+$-type contact layer 22. More specifically, the present invention has, as can be seen in FIGS. 13 and 14, a structure in which the shape of the p$^+$-type contact layers 22 shown in FIG. 11 is changed, and island-like p$^+$-type contact layer 22b is formed selectively in the p-type drain layer 21 so as to be along the direction normal to the current path. It should be noted the p$^+$-type contact layers 22 and 22b have the same impurity concentration.

In this embodiment, the p$^+$-type contact layer 22b consists of a plurality of squares each having a side of 2 μm, which are arranged at an interval of 10 μm in the direction normal to the current path, and at an interval of 4 μm substantially along the current path.

In this case, the ratio in surface area between the p$^+$-type contact layer 22b and the p-type drain layer 22 is obtained to be 10% from the following equation:

$$\text{Ratio in surface area} = \frac{2\ \mu m \times 2\ \mu m}{4\ \mu m \times 10\ \mu m} \times 10 = 10\ [\%]$$

With the above-described structure, the hole injection efficiency can be furthermore lowered as compared to the cases of the first to third embodiments, and the discharging rate of holes can be furthermore increased.

That is, in the lateral-type IGBT according to the present embodiment, the p$^+$-type contact layer 22 is formed in an island-like fashion, and therefore the amount of holes accumulated in the region 24 of the n$^-$-type active layer 3, located underneath the drain electrode 14 can be easily reduced. Thus, it becomes even more easy to discharge holes. It is considered that the rate of discharging holes can be further increased for the above-described reason. It should be noted that as the island-like p$^+$-type contact layer 22 is formed to be closer to the source side, the rate of discharging the holes can be further increased.

As described above, according to this embodiment, the rate of discharging holes can be further increased, and therefore the high-speed switching characteristics and the high output characteristics can be realized at the same time with even better values, in addition to the advantage achieved by the third embodiment.

This embodiment was described in connection with the case where the ratio in surface area between the p$^+$-type contact layer 22b and the p-type drain layer 22 is 10%; however, as mentioned before, it is only natural that the embodiment can be modified such that the ratio in the surface area falls in a range of 10 to 78%.

Further, with regard to FIGS. 5 to 14, it is very effective for achieving a high voltage proof, to have a structure in which the layers are arranged symmetrically with respect to the left-hand side of each figure.

Fifth Embodiment

Figure 16:
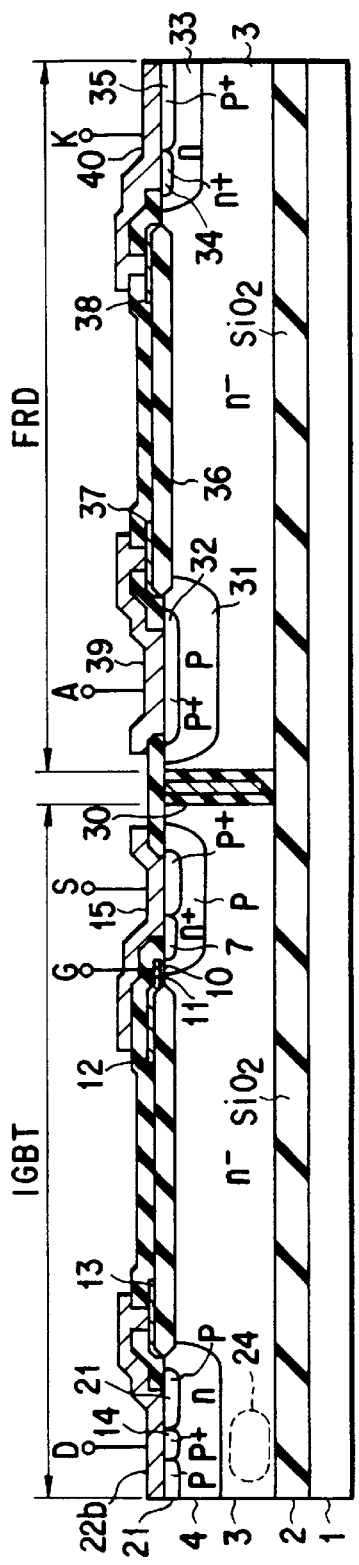
FIG. 16 is a cross sectional view showing the structure of a semiconductor device according to the fifth embodiment of the present invention.

FIG. 16 is a cross sectional view illustrating the structure of a semiconductor device according to the fifth embodiment of the present invention. The same structural elements as those in FIG. 14 are designated by the same reference numerals, and the detailed descriptions therefor will not be provided. The different portions will be discussed mainly here.

Figure 17:
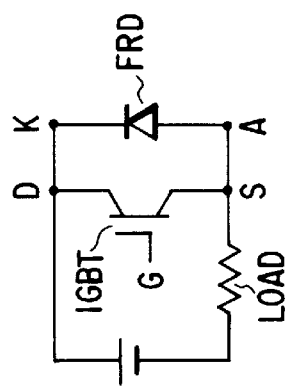
FIG. 17 is a circuit diagram illustrating the connections of the circuits in the semiconductor of this embodiment.
Figure 15:
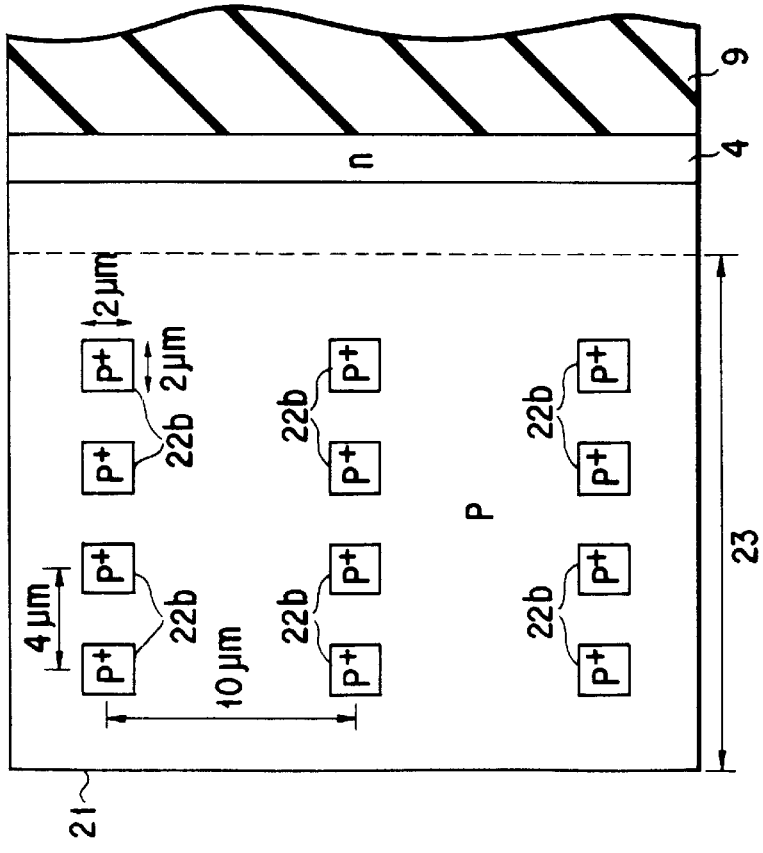
FIG. 15 is a plan view showing the location of the $p^+$-type contact layer in this embodiment.

This embodiment is a remodeled version in which another element is formed together with an IGBT. For example, as can be seen in FIGS. 16 and 17, a free wheeling diode (FRD) is formed together with the IGBT. In other words, this embodiment is an example of the application of the present invention to an inverter device.

More specifically, in this embodiment, an element separation layer 30 which uses a trench is formed from the surface of the n$^-$-type active layer 3 to such a depth to reach the buried oxide layer 2. With the trench, the n-type active layer 3 is isolated into an IGBT region and an FRD region. In the IGBT region, such an IGBT as described above is formed, and therefore the description therefor will be omitted.

The FRD region is a region where a free wheeling diode is formed. The p-type emitter layer 31 is formed selectively in the surface portion of the n$^-$-type active layer 3 such as not to reach the buried oxide layer 2, and the p$^+$-type anode layer 32 is formed selectively in the surface portion of the p-type emitter layer 31.

In another the surface portion of the n$^-$-type active layer 3 which is separated from the p-type emitter layer 31, the n-type buffer layer 33 is formed selectively such as not to reach the buried oxide layer 2, and in the surface portion of the n-type buffer layer 33, an n$^+$-type cathode layer 34 and a p$^+$-type contact layer 35 are selectively formed.

In the surface region from a portion of the p-type emitter layer 31 to the vicinity of the n-type buffer layer 33 in the n$^-$-type active layer 3, a LOCOS oxide film 36 is formed. On the LOCOS oxide film 36, an A-side field plate 37 is formed in the vicinity of the p-type emitter layer 31, and a K-side field plate 38 is formed in the vicinity of the n-type buffer layer 33.

On the p$^+$-type anode layer 32, an anode electrode 39 is formed to be in contact with a portion of the surface of the A-side field plate 37. Further, on the n$^+$type cathode layer 34 and the p$^+$-type contact layer 35, a cathode electrode 40 is formed to be in contact with a portion of the surface of the K-side field plate 38.

It should be noted that the cathode electrode 40 is electrically connected to the drain electrode 14 as can be seen in FIG. 17, and similarly the anode electrode 39 is electrically connected to the source electrode 15.

With the above-described structure, an inverter device having the advantage of the fourth embodiment can be formed on one chip. Since this embodiment describes that an IGBT and an FRD can be formed on one chip, the feature of this embodiment can be applied not only to the IGBT of the fourth embodiment, but also to each of the IGBTs of the first to third embodiments.

Other Embodiments

The above-described embodiments were described in connection with various types of p-type drain layers 21 and p$^+$contact layer 22, having different shapes. However, the present invention is not limited those discussed in the above embodiments, but the present invention can be applied to any other pattern shapes of these layers to obtain a similar advantage as long as a p-type drain layer 21 and a p$^+$-type contact layer 22 are used in the structure.

Similarly, as long as the second conductivity type drain layer having a low impurity concentration, for decreasing the efficiency for holes, and the second conductivity type contact layer having a high impurity concentration, for avoiding an increase in contact resistance are used, the present invention can be applied to any case to achieve a similar advantage, even though the specific impurity concentration, pattern shape, depth of pattern and the like are varied in many versions.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, comprising:

a semiconductor substrate;

an insulating layer formed on said semiconductor substrate;

a first conductivity type active layer having a high resistance and formed on said insulating layer;

a first conductivity type buffer layer formed in a surface portion of said first conductivity type active layer;

a second conductivity type drain layer formed in a surface portion of said first conductivity type buffer layer;

a second conductivity type contact layer formed in a surface portion of said second conductivity type drain layer, said second conductivity type contact layer having a concentration higher than that of said second conductivity type drain layer;

a drain electrode formed on said second conductivity type contact layer and said second conductivity type drain layer in said surface portion of said first conductivity type buffer layer;

a second conductivity type base layer formed in the surface portion of said first conductivity type active layer;

a first conductivity type source layer formed in a surface portion of said second conductivity type base layer;

a source electrode formed on said first conductivity type source layer and said second conductivity type base layer; and a gate electrode provided via a gate insulating film on said second conductivity type base layer which is interposed between said first conductivity type source layer and said first conductivity type active layer, wherein said second conductivity type contact layer is formed in an island-like shape, said second conductivity type contact layer is arranged in a direction approximately perpendicular to a current path in said second conductivity type drain layer, and said drain electrode is formed only on and in direct contact with said second conductivity type contact layer and said second conductivity type drain layer.

2. A semiconductor device, comprising:

a semiconductor substrate;

an insulating layer formed on said semiconductor substrate;

a first conductivity type active layer having a high resistance and formed on said insulating layer;

a first conductivity type buffer layer formed in a surface portion of said first conductivity type active layer;

a second conductivity type drain layer formed in a surface portion of said first conductivity type buffer layer;

a second conductivity type contact layer formed in a surface portion of said second conductivity type drain layer, said second conductivity type contact layer having a concentration higher than that of said second conductivity type drain layer;

a drain electrode formed on said second conductivity type contact layer and said second conductivity type drain layer in said surface portion of said first conductivity type buffer layer;

a second conductivity type base layer formed in the surface portion of said first conductivity type active layer;

a first conductivity type source layer formed in a surface portion of said second conductivity type base layer;

a source electrode formed on said first conductivity type source layer and said second conductivity type base layer; and a gate electrode provided via a gate insulating film on said second conductivity type base layer which is interposed between said first conductivity type source layer and said first conductivity type active layer, wherein said second conductivity type contact layer is formed in a stripe shape arranged such that a longitudinal direction of the stripe shape is approximately parallel to a current path in said second conductivity type drain layer, and said drain electrode is formed only on and in direct contact with said second conductivity type contact layer and said second conductivity type drain layer.

3. A semiconductor device, comprising:

a semiconductor substrate;

an insulating layer formed on said semiconductor substrate;

a first conductivity type active layer having a high resistance formed on said insulating layer;

a first conductivity type buffer layer formed in a surface portion of said first conductivity type active layer;

a second conductivity type drain layer formed in a surface portion of said first conductivity type buffer layer;

a plurality of second conductivity type contact structures formed in a surface portion of said second conductivity type drain layer and arranged in a direction approximately perpendicular to a direction of current flow in said device, said second conductivity type contact structures having a concentration higher than that of said second conductivity type drain layer and each comprising a plurality of island regions arranged in a direction approximately parallel to said direction of current flow;

a drain electrode formed only on and in direct contact with said second conductivity type contact structures and said second conductivity type drain layer;

a second conductivity type base layer formed in the surface portion of said first conductivity type active layer;

a first conductivity type source layer formed in a surface portion of said second conductivity type base layer;

a source electrode formed on said first conductivity type source layer and said second conductivity type base layer; and a gate electrode provided via a gate insulating film on said second conductivity type base layer which is interposed between said first conductivity type source layer and said first conductivity type active layer.

4. A semiconductor device according to claim 3, wherein said plurality of contact structures have a surface area within a range of 10 to 78% in comparison with a surface area of said second conductivity type drain layer.

5. A semiconductor device according to claim 3, wherein an impurity concentration of a surface of said second conductivity type contact layer is $1 \times 10^{19}$ cm$^{-3}$ or higher, and an impurity concentration of a surface of said second conductivity type drain layer is from $1 \times 10^{18}$ to $3 \times 10^{18}$ cm$^{-3}$.

6. A semiconductor device according to claim 1, wherein said second conductivity type contact layer has a surface area within a range of 10 to 78% in comparison with a surface area of said second conductivity type drain layer.

7. A semiconductor device according to claim 1, wherein an impurity concentration of a surface of said second conductivity type contact layer is $1 \times 10^{19}$ cm$^{-3}$ or higher, and an impurity concentration of a surface of said second conductivity type drain layer is from $1 \times 10^{18}$ to $3 \times 10^{18}$ cm$^{-3}$.

8. A semiconductor device according to claim 2, wherein said second conductivity type contact layer has a surface area within a range of 10 to 78% in comparison with a surface area of said second conductivity type drain layer.

9. A semiconductor device according to claim 2, wherein an impurity concentration of a surface of said second conductivity type contact layer is $1 \times 10^{19}$ cm$^{-3}$ or higher, and an impurity concentration of a surface of said second conductivity type drain layer is from $1 \times 10^{18}$ to $3 \times 10^{18}$ cm$^{-3}$.

* * * * *